(12) United States Patent
Watkins et al.

(10) Patent No.: US 6,252,405 B1
(45) Date of Patent: Jun. 26, 2001

(54) TEMPERATURE COMPENSATED NMR MAGNET AND METHOD OF OPERATION THEREFOR

(75) Inventors: Ronald Dean Watkins, Niskayuna; William Daniel Barber, Ballston Lake; Peter George Frischmann, Ballston Spa, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/440,813

(22) Filed: Nov. 15, 1999

(51) Int. Cl.[7] ........................................ G01V 3/00
(52) U.S. Cl. ..................... 324/319; 324/320; 324/315
(58) Field of Search ................................. 324/319, 320, 324/321, 318, 300, 314, 307, 309, 315

(56) References Cited

U.S. PATENT DOCUMENTS

| | | | |
|---|---|---|---|
| 3,714,553 | * | 1/1973 | Keller .................................. 324/318 |
| 4,870,380 | | 9/1989 | McGinley ........................... 335/296 |
| 4,943,774 | | 7/1990 | Breneman et al. ................. 324/318 |
| 4,952,877 | | 8/1990 | Stormont et al. .................. 324/312 |
| 4,992,736 | | 2/1991 | Stormont et al. .................. 324/309 |
| 5,214,383 | | 5/1993 | Perlmutter et al. ................. 324/313 |
| 5,252,924 | | 10/1993 | Sakurai et al. ...................... 324/320 |
| 5,334,937 | | 8/1994 | Peck et al. .......................... 324/318 |
| 5,382,905 | | 1/1995 | Miyata et al. ...................... 324/319 |
| 5,431,165 | | 7/1995 | Sellers ............................... 128/653.5 |
| 5,592,090 | | 1/1997 | Pissanetzky ........................ 324/319 |
| 5,680,086 | | 10/1997 | Allis et al. .......................... 335/296 |
| 5,731,704 | * | 3/1998 | Schnur et al. ...................... 324/320 |
| 5,774,034 | | 6/1998 | Yoneda et al. ..................... 335/301 |
| 6,037,775 | * | 3/2000 | Shenoy et al. ..................... 324/320 |

* cited by examiner

Primary Examiner—Louis Arana
(74) Attorney, Agent, or Firm—Jill M. Breedlove; Douglas E. Stoner

(57) ABSTRACT

An MRI system includes a magnet which produces the main polarizing magnetic field. Variations in strength of this field are corrected by a temperature compensation system that calculates a compensating flux needed to maintain the field at constant strength. The compensating flux is calculated from changes in sensed magnet temperature and a magnet temperature coefficient. One or more correction coils are wound around the magnet and driven with the current necessary to produce the compensating flux.

14 Claims, 2 Drawing Sheets

TEMPERATURE COMPENSATED NMR MAGNET AND METHOD OF OPERATION THEREFOR

BACKGROUND OF THE INVENTION

This invention relates to nuclear magnetic resonance (NMR) imaging systems and methods and, more particularly, to systems and methods which compensate NMR image quality for temperature effects on the NMR system magnet.

In the past, the NMR phenomenon has been utilized by structural chemists to study, in vitro, the molecular structure of organic molecules. Typically, NMR spectrometers utilized for this purpose were designed to accommodate relatively small samples of the substance to be studied. More recently, however, NMR has been developed into an imaging modality utilized to obtain images of anatomical features of live human subjects, for example. Such images depicting parameters associated with nuclear spins (typically spins of hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with tools, for the first time, to study chemical processes in a living organism. The use of NMR to produce images and spectroscopic studies of the human body has necessitated use of specifically designed system components, such as the magnet, gradient and RF coils.

By way of background, the nuclear magnetic resonance phenomenon occurs in atomic nuclei having an odd number of protons or neutrons. Due to the spin of the protons and neutrons, each such nucleus exhibits a magnetic moment such that, when a sample composed of such nuclei is placed in a static, homogeneous magnetic field $B_0$, a majority of nuclear magnetic moments align with the field to produce a net macroscopic magnetization M in the direction of the field. Under the influence of the magnetic field $B_0$, the aligned magnetic moments precess about the axis of the field at a frequency dependent on the strength of the applied magnetic field and on the characteristics of the nuclei. The angular precession frequency ω, also referred to as the Larmor frequency, is given by the Larmor equation $\omega = \gamma B$ in which γ is the gyromagnetic ratio (which is constant for each NMR isotope) and wherein B is the magnetic field ($B_0$ plus other fields) acting upon the nuclear spins. It is thus apparent that the resonant frequency is dependent on the strength of the magnetic field in which the sample is positioned.

The orientation of magnetization M, normally directed along the magnetic field $B_0$, may be perturbed by the application of magnetic fields oscillating at or near the Larmor frequency. Typically, such magnetic fields designated $B_1$, are generated orthogonally to the direction of the $B_0$ field by RF pulses supplied through a coil connected to an RF transmitting apparatus. Under the influence of RF excitation, magnetization M rotates about the direction of the $B_1$, field. In NMR studies, it is typically desired to apply RF pulses of sufficient magnitude and duration to rotate magnetization M into a plane perpendicular to the direction of the $B_0$ field. This plane is commonly referred to as the transverse plane. Upon cessation of the RF excitation, the nuclear moments rotated into the transverse plane precess around the direction of the static field. The vector sum of the spins forms a precessing bulk magnetization which can be sensed by an RF coil. The signals sensed by the RF coil, termed NMR signals, are characteristic of the magnetic field and of the particular chemical environment in which the nuclei are situated. In magnetic resonance imaging (MRI) systems, which are systems that employ NMR imaging, the NMR signals are observed in the presence of magnetic-field gradients which are utilized to encode spatial information into the signals. This information is later used to reconstruct images of the object studied in a manner well-known to those skilled in the art.

A common NMR imaging problem results from the temperature dependent nature concerning operation of NMR magnetic sources, such as a permanent magnet used to produce the $B_0$ field (the "$B_0$ magnet"). That is, temperature changes in the $B_0$ magnet alter the strength of the otherwise static $B_0$ field. Temperature changes are the ordinary consequence of temperature gradients in a testing room, such as may result from localized positioning of warm lights or air conditioning/heating vents. Temperature gradients may cause different parts of the magnet to have different temperatures. For example, warm lighting located in the ceiling may cause an upper part of a magnet to be warmer than its corresponding lower portion. Alternatively, the entire magnet may have the same temperature, but one that changes over time, such as when a room heats up or cools down over the course of a day.

Regardless of whether the $B_0$ magnet is subjected to localized or generalized temperature variation, it is desirable for NMR imaging to produce a homogeneous $B_0$ field of precise strength, typically for extended periods of time. However, normal temperature changes in the $B_0$ magnet (as discussed above) lead to undesirable variations in $B_0$ field strength, which changes the Larmor frequency, resulting in image degradation.

What is needed is a system and method to compensate for temperature changes in the $B_0$ magnet, thereby improving NMR image quality.

BRIEF SUMMARY OF THE INVENTION

The invention permits maintaining consistent $B_0$ field strength, thereby improving NMR image quality. This is accomplished by determining temperature of the magnet providing the $B_0$ field. This temperature and a known coefficient are used to determine how much the $B_0$ field will vary (without flux compensation) from the desired $B_0$ field strength due to magnet temperature deviating from an ideal operating temperature. The known coefficient governs the relationship between magnet temperature and the impact of magnet temperature on the resulting $B_0$ field. A driver provides current through one or more correction coils around one or more portions of the magnet to furnish an amount and polarity of compensating flux appropriate to maintain $B_0$ field consistency, thereby compensating for temperature variation of the magnet and the associated impact on $B_0$ field strength.

DESCRIPTION OF THE PREFERRED EMBODIMENTS

Figure 1:
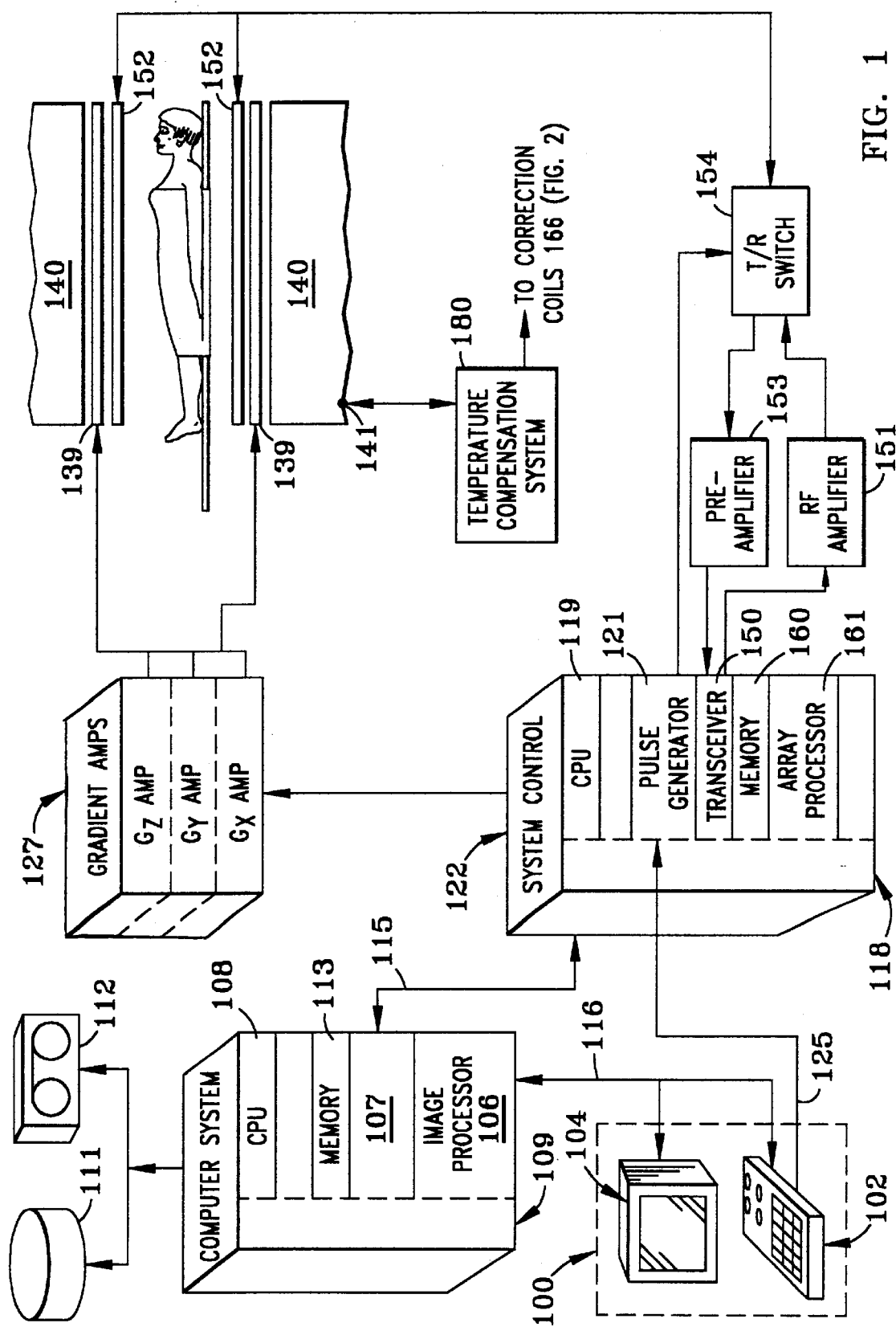
FIG. 1 is a block diagram of an MRI system employing the invention.

FIG. 1 illustrates the major components of a magnetic resonance imaging (MRI) system which incorporates the invention. System operation is controlled from an operator console 100 which includes a keyboard and control panel 102 and a display 104. Console 100 communicates through a link 116 with a separate computer system 107 that enables an operator to control the production and display of images on screen 104. The computer system includes a number of modules which communicate with each other through a backplane 109. These modules include an image processor 106, a CPU 108 and a memory 113, known in the art as a frame buffer for storing image data arrays. Computer system 107 is linked to a disk storage 111 and tape drive 112 for storage of image data and programs, and communicates with a separate system control 122 through a high speed serial link 115.

System control 122 includes a set of modules interconnected through a backplane 118. Among the modules are a CPU 119 and a pulse generator 121 which connects to operator console 100 through a serial link 125. Through link 125, system control 122 receives commands from the operator which designate the scan sequence to be performed. Pulse generator module 121 operates the system components to carry out the desired scan sequence, producing data which specify the timing, strength and shape of the RF pulses to be produced, and the timing and length of the data acquisition window. Pulse generator module 121 connects to a set of gradient amplifiers 127 to designate the timing and shape of the gradient pulses to be produced during the scan.

The gradient waveforms produced by pulse generator module 121 are applied to gradient amplifier system 127 comprised of $G_x$, $G_y$ and $G_z$ amplifiers. Each gradient amplifier excites a corresponding gradient coil in an assembly 139 to produce the magnetic field gradients used for position encoding acquired signals. Gradient coil assembly 139 forms part of a magnet assembly which includes a polarizing magnet 140 and a whole-body RF coil 152.

A transceiver module 150 in system control 122 produces pulses that are amplified by an RF amplifier 151 and provided to RF coil 152 by a transmit/receive switch 154. The resulting signals radiated by the excited nuclei in the patient may be sensed by the same RF coil 152 and provided through transmit/receive switch 154 to a preamplifier 153. The amplified NMR signals are demodulated, filtered, and digitized in the receiver section of transceiver 150. Transmit/receive switch 154 is controlled by a signal from pulse generator module 121 to electrically couple RF amplifier 151 to coil 152 for the transmit mode and to couple preamplifier 153 to coil 152 for the receive mode. Transmit/receive switch 154 also enables a separate RF coil, for example, a head coil or surface coil, (not shown) to be used in either the transmit or receive mode.

The NMR signals picked up by RF coil 152 are digitized by transceiver module 150 and transferred to a memory module 160 in system control 122. When the scan is completed and an entire array of data has been acquired in memory module 160, an array processor 161 operates to Fourier transform the data into an array of image data. These image data are conveyed through serial link 115 to computer system 107 where they are stored in disk memory 111. In response to commands received from operator console 100, these image data may be archived on tape drive 112, or may be further processed by image processor 106 and conveyed to operator console 100 for presentation on display 104.

For a more detailed description of the transceiver 150, reference is made to commonly assigned Stormont et al. U.S. Pat. Nos. 4,952,877, issued Aug. 28, 1990 and 4,992,736 issued Feb. 12, 1991, both of which patents are hereby incorporated by reference.

A temperature compensation system 180 determines the requisite amount and polarity of flux to add to the static $B_0$ field produced by polarizing magnet 140 to compensate for temperature-induced variation in the $B_0$ field and to maintain $B_0$ field homogeneity. In making this determination, system 180 senses polarizing magnet temperature to determine its deviation from ideal operating temperature. Alternatively, Larmor frequency may be sensed to establish deviation from ideal Larmor frequency, as this frequency difference is related to deviation from ideal operating temperature for polarizing magnet 140. From the amount of deviation from ideal temperature or ideal Larmor frequency, and utilizing a stored coefficient governing the impact of these deviations on $B_0$ field strength, system 180 computes compensation flux and provides suitable current through one or more correction coils (shown in FIG. 2) which wrap around polarizing magnet 140 to produce the desired compensation flux and/or are located on the gradient assembly 139 or RF assembly 152.

Figure 2:
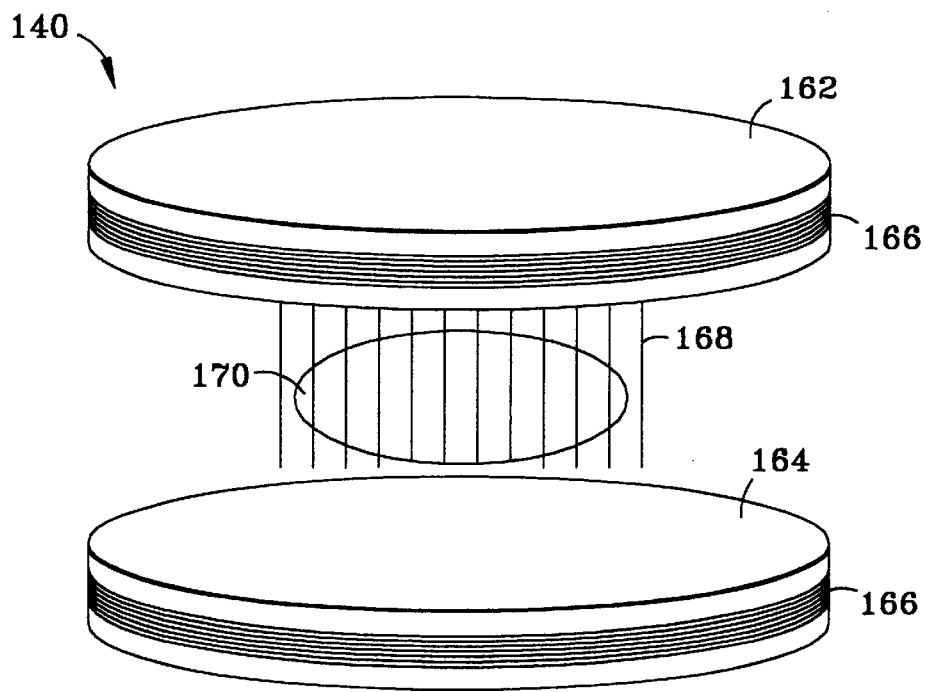
FIG. 2 is a perspective view of a polarizing magnet for the MRI system of FIG. 1.

FIG. 2 is a simplified representation of polarizing magnet 140, used to produce the main polarizing magnetic field or $B_0$ field 168, and may also be referred to as "$B_0$ magnet 140." Magnet 140 includes two opposing permanent magnets, namely upper magnet 162 and lower magnet 164, separated by an imaging volume 170 (or gap), thru which $B_0$ field 168 passes. $B_0$ magnet 140 may comprise any conventional magnetic source for $B_0$ field 168, such as an iron-core-resistive electromagnet or a superconducting magnet, though permanent magnets are typically used. Permanent magnets are particularly susceptible to temperature-driven variations, as manifested in the $B_0$ field which they produce. Thus, permanent magnets 162 and 164 typically have conventionally determined coefficients which govern the relationship between magnet temperature and $B_0$ field 168 which they produce. This change in $B_0$ field 168 as a function of magnet temperature is expressed as a temperature coefficient which is measured or is provided by the magnet supplier.

The description herein of $B_0$ magnet 140 and its depiction in FIG. 2 is merely exemplary, as various changes in its shape, size, type, configuration, and the like are possible. For example, while the strength of $B_0$ magnet 140 may be in the range of 0.1 to 0.35 Tesla, field strength outside this range is possible.

Correction coils 166 are wrapped around peripheral portions of $B_0$ magnet 140. Here, this means one correction coil 166 for each of upper magnet 162 and lower magnet 164, respectively. More generally, correction coils 166 comprise one or more conductive coils wound around some portion or portions of $B_0$ magnet 140 such that magnetic flux produced by coils 166 is added to $B_0$ field 168 produced by $B_0$ magnet 140.

Figure 3:
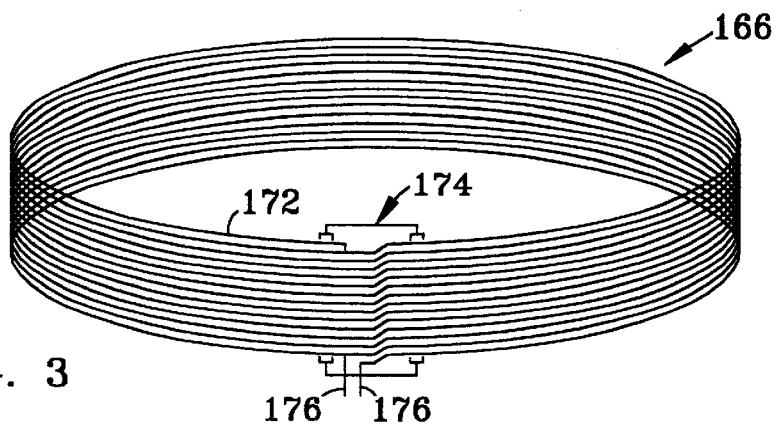
FIG. 3 is a perspective view of a correction coil for use with the polarizing magnet of FIG. 2.

A specific embodiment of correction coil 166, as shown in FIG. 3, includes a multi-conductor ribbon cable 172 interconnected with circuit board 174. Ribbon cable 172 provides a plurality of parallel conductors connected through circuit board 174. More particularly, an end of each conductor is connected, through circuit board 174, to the beginning of the next adjacent conductor in ribbon cable 172 to form a continuous set of inductive windings. Ribbon cable 172 may comprise a 24 conductor, 18-gauge ribbon cable manufactured by AMP, Inc. under the designation cable no. 2-642099-4, and providing 0.006 ohms/foot (and 2 ohms total resistance). Circuit board 174 may comprise an MTA-156 connector made by AMP, Inc. under part no. designation 2-641148-4.

One or more correction coils 166 may be wrapped around either one or both of magnets 162 and 164. If more than one correction coil 166 is provided per magnet 162 and/or 164, the correction coils 166 may be arranged spatially in any convenient manner. For example, correction coils 166 may be wound about a given magnet, adjacent to the magnet. Alternatively, multiple correction coils 166 may be wound about a given magnet such that the coils overlay one another. Though these and other spatial arrangements are permitted, only one correction coil 166 is shown per magnet 162 and 164, in the interest of drawing simplification.

Correction coils 166 may be connected electrically in series. In this configuration, each coil 166 has one of its taps 176 connected to a tap 176 of the other coil 166, and the remaining taps 176 are connected to a high and a low lead from a driver (not shown) for providing current through the correction coils. In an alternative configuration, correction coils 166 are independently driven, meaning each coil 166 has its own respective driver.

Figure 4:
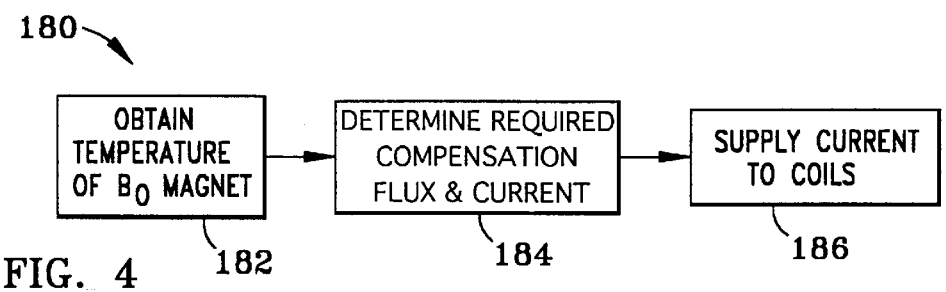
FIG. 4 is a simplified flow diagram depicting a system methodology employed by the invention.

Operation of temperature compensation system 180 is represented by FIG. 4. To simplify the discussion of system operation, reference is made simply to $B_0$ magnet 140, understanding that all of the different forms that it may take (including the pair of opposing magnets 162 and 164 from FIG. 2) may be used in the system.

As a first step 182, temperature of $B_0$ magnet 140 is conventionally obtained. For example, temperature at given locations may be obtained by use of infrared radiation sensors, or by temperature sensors 141, such as thermocouples or thermistors, placed on, or embedded in, one or more appropriate locations of $B_0$ magnet 140. Direct temperature readings taken at one or more locations of $B_0$ magnet 140 may also be used in conventional manner to extrapolate temperatures for various positions in $B_0$ magnet 140.

Alternatively, magnet temperature may be ascertained indirectly in temperature compensation system 180 by determining the difference in Larmor frequency under two conditions. Specifically, the Larmor frequency obtained under ideal operating conditions is compared with the Larmor frequency obtained under present operating conditions. The computed difference in Larmor frequency is attributable in large part to $B_0$ magnet 140 being at other than ideal operating temperature. This is understood by recalling that Larmor frequency is proportionately related to the magnitude of $B_0$ field 168, the strength of which is related to the temperature of $B_0$ magnet 140.

Now, the temperature of $B_0$ magnet 140 being known, this information is used at step 184 to determine the amount of $B_0$ field compensation required to maintain a uniform $B_0$ field 168. The relationship between the temperature of $B_0$ magnet 140 and the $B_0$ field which it produces is given by a temperature-to-field-strength conversion coefficient (more simply referred to hereafter as the "TTFS coefficient"). This temperature coefficient can be measured, but it typically is provided by the magnet manufacturer and can be expressed in units of parts per million per degree Celsius (PPM/° C.). For example, $B_0$ magnet 140 may be a Neodymium Iron Boron (NdFeB) magnet. Such magnets are generally sensitive to temperature changes, and have a negative TTFS coefficient of approximately 0.13%/° C. or 1300 PPM/° C. Here, PPM may refer to a ratio of $B_0$ field strength (e.g., micro-Tesla/Tesla, or micro-gauss/gauss) or a ratio of Larmor frequency (e.g., hertz/mega-hertz).

Thus, the amount of $B_0$ field compensation required for $B_0$ field homogeneity is determined using the change from ideal magnet temperature (or ideal Larmor frequency) and the TTFS coefficient for $B_0$ magnet 140. As part of this determination, if the temperature of $B_0$ magnet 140 increases, the strength of $B_0$ field 168 becomes reduced, necessitating addition of like polarity compensating flux to maintain the $B_0$ field constant. Alternatively, a temperature decrease for $B_0$ magnet 140 increases $B_0$ field magnitude, requiring employment of an opposing polarity compensating flux to maintain the $B_0$ field constant.

When the desired quantity and polarity of compensating flux ($\phi$) has been determined, the current required to produce the desired flux compensation is determined from the formula $I=\phi/N$, where N is the number of turns in correction coils 166. At step 186, one or more drivers supply the necessary current through correction coils 166 to provide the required compensation flux.

If more than one correction coil 166 is used (e.g., as shown in FIG. 2), the coils 166 may be supplied with current from a single driver, and be electrically connected in series or in parallel. Alternatively, coils 166 may be independently supplied with current by separate drivers.

Whether a single driver is used in a series or parallel coil configuration, or even if multiple independent drivers are used, each configuration may be used to provide different quantities and/or polarities of compensation flux per correction coil 166. As suggested, it may be advantageous to have different flux compensation distributions (e.g., in a room having locally high temperatures in proximity to ceiling lighting).

For single-driver, series-connected coils 166, different flux compensation patterns can be accomplished by providing different numbers of conductors per coil between an upper and lower correction coil 166. This can be done by using ribbon cables 172 (FIG. 3) with different numbers of conductors. Alternatively, ribbon cables 172 with the same number of conductors may be used, with some of the conductors in one or more of coils 166 bypassed, so that coils 166 have different numbers of conductors to provide different flux distributions. Bypassing may alternatively be accomplished by "jumping out" a desired number of conductors on a ribbon cable 172. This involves connecting the output tap 176 of the subject coil 166 to skip a desired number of conductors in ribbon cable 172. As another alternative, one may dynamically bypass a desired number of ribbon cable conductors, using, for example, a multiplexor for selecting a desired one of the ribbon cable conductors. For the single-driver, parallel-connected coil configuration, input resistances to coils 166 may be provided, appropriately selected to result in the driver providing the desired different currents to the separate correction coils 166. If multiple independent drivers are used, then the respective drivers may be adjusted to supply the required current to their respective correction coils 166 in order to establish the desired differential flux compensation.

While only certain preferred features of the invention have been illustrated and described, many modifications and changes will occur to those skilled in the art. For example, while the correction coils 166 typically comprise ribbon cable 172 and circuit board connector 174, coils 166 may be provided by any type or arrangement of coil supplying the requisite compensating flux. It is, therefore, to be understood that the appended claims are intended to cover all such modifications and changes as fall within the true spirit of the invention.

What is claimed is:

1. Apparatus for producing a substantially constant polarizing magnetic field in an NMR system, which comprises:
   a) a magnet for producing a static polarizing magnetic field that changes in strength as a function of magnet temperature;

b) means responsive to temperature of the magnet during an imaging operation for determining a compensating flux based upon said temperature; and c) correction coils for producing the determined compensating flux such that the sum of said compensating flux and the polarizing magnetic field flux remains substantially constant as variations occur in magnet temperature.

2. The apparatus of claim 1 wherein the magnet comprises a permanent magnet.

3. The apparatus of claim 1 wherein the magnet comprises a permanent magnet having two portions separated by a gap for holding a sample to be tested.

4. The apparatus of claim 1 wherein the correction coils comprise ribbon cable having a plurality of conductors interconnected by a circuit board to form a continuous set of inductive windings.

5. The apparatus of claim 1 wherein the correction coils are wrapped around a portion of the magnet.

6. The apparatus of claim 3 wherein the correction coils (166) are wrapped around said two portions of the magnet.

7. The apparatus of claim 6 wherein the connection coils are electrically connected in series.

8. The apparatus of claim 1 wherein the means responsive to temperature of the magnet comprises temperature sensors.

9. The apparatus of claim 8 wherein the temperature sensors are selected from the group consisting of thermocouples, thermistors, and infrared radiation sensors.

10. A method of compensating for temperature-induced variations in a static polarizing field produced by a magnet of an MRI system, comprising the steps of:

a) sensing magnet temperature during an imaging operation;

b) determining a compensating magnetic flux from the sensed magnet temperature and a magnet temperature coefficient; and c) supplying the compensating magnetic flux through a correction coil so as to combine the compensating flux with the polarizing field.

11. The method of claim 10 wherein the magnet is a permanent magnet.

12. The method of claim 11 wherein the step of supplying the compensating magnetic flux includes:

a) wrapping said correction coil around a portion of the permanent magnet; and b) providing an appropriate electrical current in the coil to produce the compensating magnetic flux.

13. Apparatus for producing a substantially constant polarizing magnetic field in an NMR system, which comprises:

a) a magnet for producing a static polarizing magnetic field that changes in strength as a function of magnet temperature;

b) means for measuring Larmor frequency and determining a compensating flux based upon any difference between larmor frequency during actual operating conditions and larmor frequency under ideal operating conditions; and c) a correction coil for producing the calculated compensating flux such that the sum of said compensating flux and the polarizing magnetic field flux remains substantially constant as variations occur in magnet temperature.

14. The apparatus of claim 13 wherein the correction coil is wrapped around a portion of the magnet.

* * * * *